United States Patent
Sahoda et al.

[11] Patent Number: 5,706,930
[45] Date of Patent: Jan. 13, 1998

[54] METHOD OF AND APPARATUS FOR TRANSFERRING CIRCULAR OBJECT

[75] Inventors: Tsutomu Sahoda; Koji Ueda; Hidenori Miyamoto; Toru Arikawa, all of Kanagawa, Japan

[73] Assignee: Tokyo Ohka Kogyo Co., Ltd., Kanagawa, Japan

[21] Appl. No.: 637,356

[22] Filed: Apr. 24, 1996

[30] Foreign Application Priority Data

Apr. 24, 1995 [JP] Japan .................................. 7-098176

[51] Int. Cl.$^6$ ...................................... B65G 29/00
[52] U.S. Cl. ........................... 198/464.2; 414/217
[58] Field of Search ........................... 198/376, 377, 198/464.1, 464.2; 414/217, 222

[56] References Cited

U.S. PATENT DOCUMENTS

| | | |
|---|---|---|
| 4,836,733 | 6/1989 | Hertel et al. ............. 198/464.2 X |
| 5,139,132 | 8/1992 | Licht ......................... 198/376 |
| 5,405,230 | 4/1995 | Ono et al. ................... 414/217 |
| 5,486,080 | 1/1996 | Siesadzki .................... 414/217 |
| 5,641,264 | 6/1997 | Kuno et al. ............. 198/464.1 X |

*Primary Examiner*—James R. Bidwell
*Attorney, Agent, or Firm*—Weiner, Carrier, Burt & Esser, P.C.; Joseph P. Carrier; Irving M. Weiner

[57] ABSTRACT

When a carrier arm is retracted, a semiconductor wafer carried thereon passes between three light-emitting elements and three light-detecting elements associated therewith. At this time, a controller determines six points on the outer circumferential edge of the semiconductor wafer based on signals from sensors made up of the light-emitting elements and the light-detecting elements. The controller selects three of the determined points, determines the center of a circumscribed circle passing through the selected three points, and regards the determined center as the center of the semiconductor wafer. Then, the controller controls movement of the semiconductor wafer toward a rotary-cup coating device, an evacuating drying device, or an edge cleaning device based on the center of the semiconductor wafer.

13 Claims, 5 Drawing Sheets

METHOD OF AND APPARATUS FOR TRANSFERRING CIRCULAR OBJECT

BACKGROUND OF THE INVENTION

1. Field of the Invention

The present invention relates to a method of and an apparatus for transferring a circular object such as a semiconductor wafer to a desired position.

2. Description of the Related Art

Conveyor belts or transfer robots are employed to receive circular objects such as semiconductor wafers and transfer received circular objects to a desired position on a production line.

General transfer apparatus including such conveyor belts or transfer robots have an alignment station in an upstream or downstream location on the production line, for accurately positioning the circular objects with respect to the production line. However, when the alignment station is used it makes the entire production line large in size and complex in structure, and a period of time required for the alignment station to position the circular objects tends to reduce the efficiency of the production line.

Some transfer robots have a structure for gripping an outer circumferential edge of circular objects. The instant such a transfer robot grips an outer circumferential edge of a circular object, the transfer robot mechanically positions the circular object to align its center. Therefore, a production line which incorporates the transfer robot does not need any alignment station. However, since the transfer robot grips an outer circumferential edge of a circular object, if the transfer robot handles a semiconductor wafer coated with a solution on its surface, then fingers of the transfer robot touch the coated solution on the semiconductor wafer. When the fingers of the transfer robot touch the coated solution, they may make the thickness of the coated solution irregular or may carry a deposit of the solution, which tends to be scattered as suspended particles that will lower the throughput of the production line.

SUMMARY OF THE INVENTION

It is therefore an object of the present invention to provide an efficient method of transferring a circular object while accurately positioning the same without causing damage to the circular object.

Another object of the present invention is to provide an apparatus for transferring a circular object while accurately positioning the same without a separate alignment mechanism for aligning the circular object.

According to the present invention, there is provided a method of transferring a circular object, comprising the steps of moving the circular object across at least two sensors while supporting a lower surface of the circular object, detecting at least three points on an outer circumferential edge of the circular object with the at least two sensors, determining the center of a circumscribed circle passing through the detected three points, regarding the determined center as a center of the circular object, and transferring the circular object based on the regarded center of the circular object.

According to the present invention, there is also provided an apparatus for transferring a circular object, comprising carrier means for moving the circular object along a path while supporting a lower surface thereof, at least two sensors disposed in the path, for detecting at least three points on an outer circumferential edge of the circular object while being moved by the carrier means, and a controller for determining the center of a circumscribed circle passing through the detected three points and regarding the determined center as a center of the circular object, and controlling movement of the carrier means based on the regarded center of the circular object.

The apparatus may further comprise a housing, and the carrier means may comprise a carrier arm movably mounted on the housing for movement along the path.

Alternatively, the apparatus may further comprise a housing, and the carrier means may comprise a pair of carrier arms movably mounted on the housing for movement along the path, the carrier arms being superposed one over the other out of interference with each other.

The circular object may comprise a semiconductor wafer having an orientational flat edge in the outer circumferential edge thereof, and three sensors may be disposed in the path, for detecting the at least three points on the outer circumferential edge, except on the orientational flat edge thereof, of the semiconductor wafer. If two sensors were used in combination with such a semiconductor wafer having an orientational flat edge in the outer circumferential edge thereof, then it would be impossible to obtain the circumscribed circle in the case where one of the sensors would be positioned at the orientational flat edge.

With the above arrangement, since the center of the circular object can be determined without touching the outer circumferential edge of the circular object, the outer circumferential edge of the circular object is protected against damage, and any coated solution on the circular object will not be touched by and attached to the carrier means.

No separate alignment station for aligning the circular object is necessary because the center of the circular object is determined while the circular object is being moved by the carrier means.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
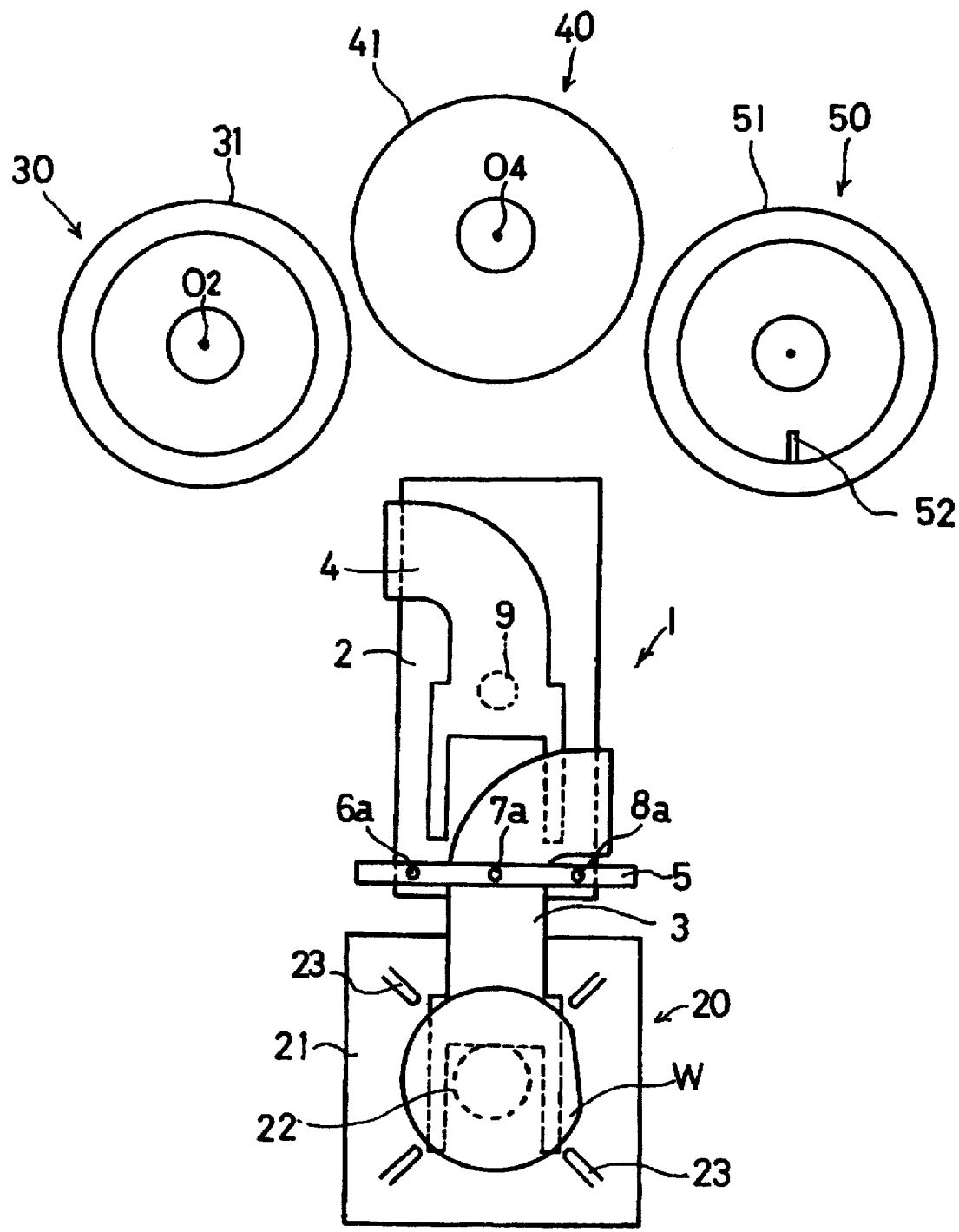
FIG. 1 is a plan view of a coating-drying-cleaning station which incorporates a transfer apparatus according to the present invention.
Figure 2:
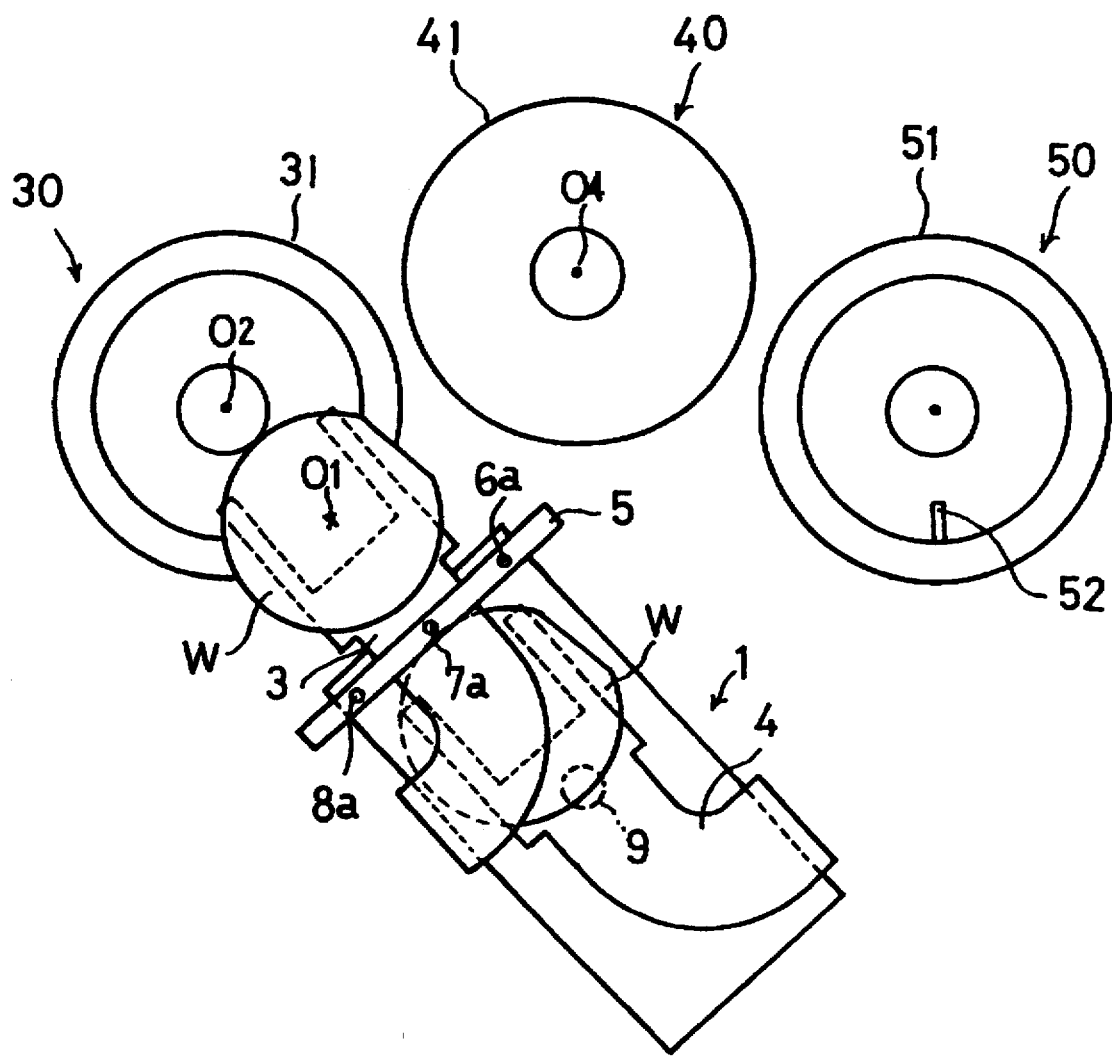
FIG. 2 is a plan view of the coating-drying-cleaning station shown in FIG. 1, showing a phase of operation thereof.
Figure 2:
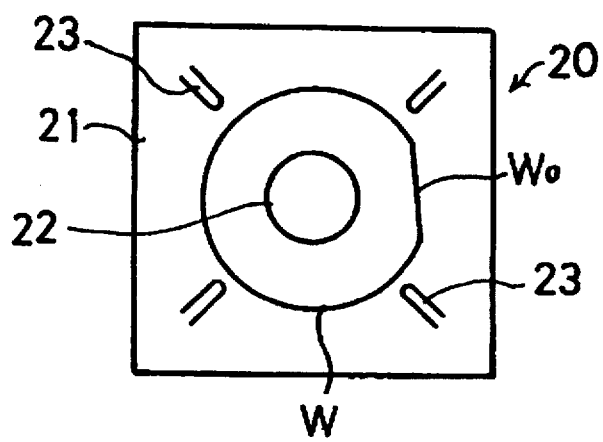
Figure 3:
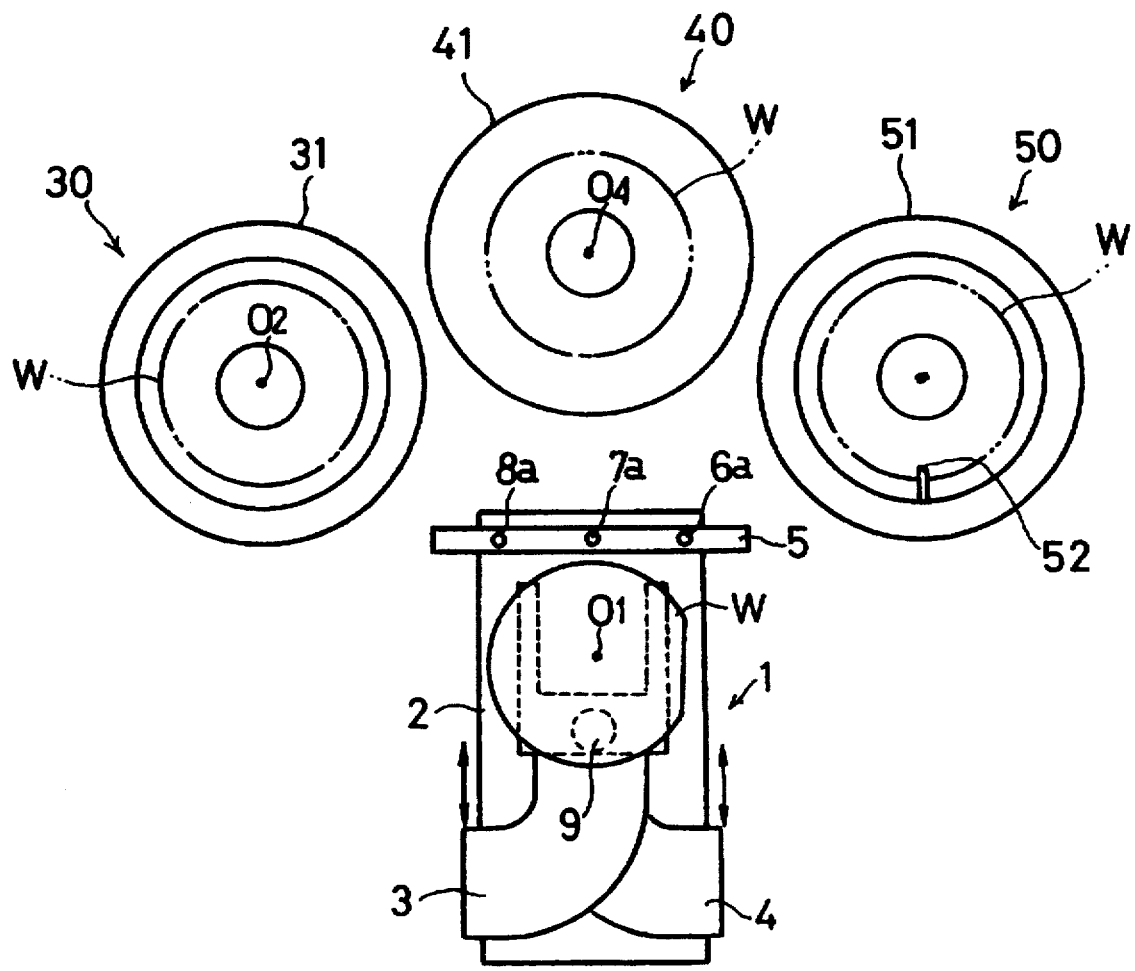
FIG. 3 is a plan view of the coating-drying-cleaning station shown in FIG. 1, showing another phase of operation thereof.
Figure 3:
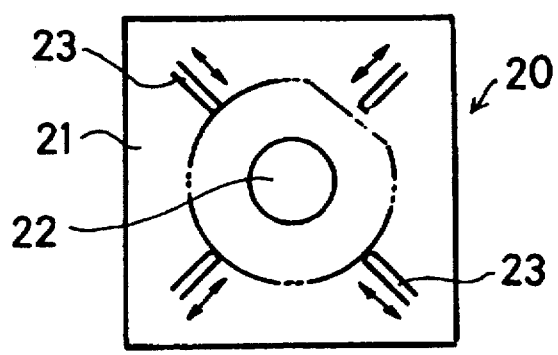

As shown in FIGS. 1 through 3, a coating-drying-cleaning station generally comprises a transfer apparatus 1 according to the present invention which is located in a central position, a loading/unloading device 20, a rotary-cup coating device 30, an evacuating drying device 40, and an edge cleaning device 50 which are positioned around the transfer apparatus 1.

Figure 4:
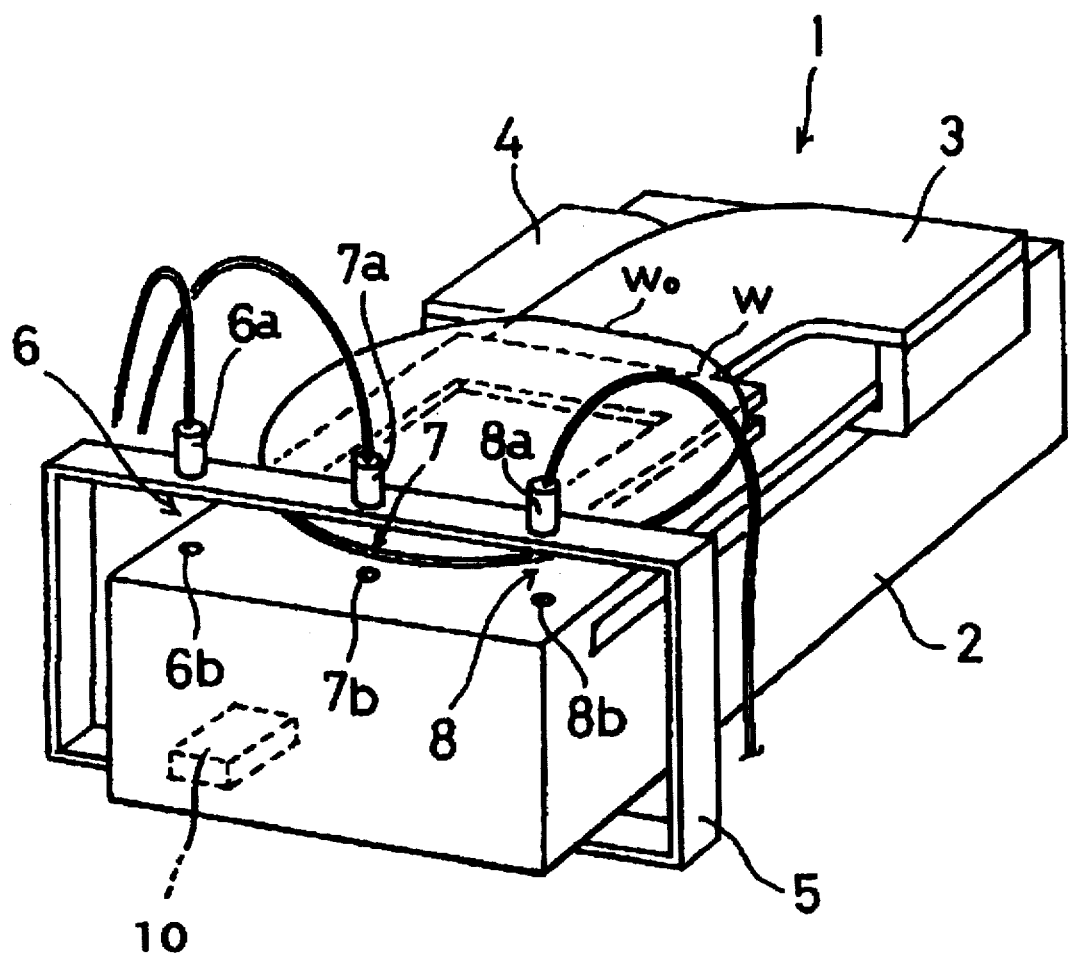
FIG. 4 is a perspective view of the transfer apparatus according to the present invention.

As shown in FIG. 4, the transfer apparatus 1 comprises an elongate box-like housing 2 and a pair of horizontal carrier arms 3, 4 disposed over an upper wall of the housing 2 and superposed one over the other out of interference with each other. The carrier arms 3, 4 are independently movable in the longitudinal direction of the housing 2 by an actuator mechanism (not shown) disposed in the housing 2.

A rectangular frame 5 is attached to an end of the housing 2 in surrounding relation thereto, and supports three spaced light-emitting elements 6a, 7a, 8a on an upper horizontal member of the frame 5. The upper wall of the housing 2 supports three spaced light-detecting elements 6b, 7b, 8b in vertical alignment with the light-emitting elements 6a, 7a, 8a, respectively. The light-emitting element 6a and the light-detecting element 6b jointly make up a sensor 6. The light-emitting element 7a and the light-detecting element 7b jointly make up a sensor 7. The light-emitting element 8a and the light-detecting element 8b jointly make up a sensor 8.

The housing 2 is angularly movable in a horizontal plane about a vertical shaft 9 (see FIGS. 1 through 3) positioned centrally in the housing 2, and also vertically movable by the actuator mechanism. The housing 2 accommodates a controller 10 for controlling the actuator mechanism to control the angular displacement and vertical movement of the housing 2 and also the longitudinal movement of the carrier arms 3, 4. The controller 10 also processes signals from the sensors 6, 7, 8. The controller 10 may comprise an electronic circuit, a microcomputer, the like.

As shown in FIGS. 1 through 3, the loading/unloading device 20 comprises a rectangular base 21, a circular support table 22 mounted on the base 21 for supporting a semiconductor wafer W, and four equally angularly spaced positioning pins 23 mounted on the base 21 around a support table 22. When the semiconductor wafer W is placed on the support table 22, the positioning pins 23 are moved radially inwardly toward the center of the support table 22 to position the semiconductor wafer W in axial alignment with the support table 22 as shown in FIG. 3.

The semiconductor wafer W has an orientational flat edge Wo (see FIG. 2) on its outer circumferential surface which is used to position the semiconductor wafer W in other processing steps. Even if one of the positioning pins 23 engages the orientational flat edge Wo, the other three positioning pins 23 are effective to position the semiconductor wafer W in axial alignment with the support table 22. The loading/unloading device 20 may have more than four positioning pins 23, e.g., five or six positioning pins 23.

The transfer apparatus 1 itself has a mechanism (described later on) for aligning the semiconductor wafer W. Therefore, the loading/unloading device 20 need not position the semiconductor wafer W for alignment, and hence the positioning pins 23 may be dispensed with.

The rotary-cup coating device 30 comprises an inner cup (not shown) rotatably disposed in an outer cup 31. After the semiconductor wafer W is placed in the inner cup and a coating solution is dropped onto the upper surface of the semiconductor wafer W, upper openings of the outer cup 31 and the inner cup are closed by respective lids (not shown), and the inner cup is rotated to cause the coating solution to spread uniformly over the upper surface of the semiconductor wafer W under centrifugal forces.

The evacuating drying device 40 has a wafer support table (not shown) disposed in a case 41. When the semiconductor wafer W with its surface coated with the coating solution is placed on the wafer support table, the case 41 is closed by a lid (not shown), and then the case 41 is evacuated to remove the solvent in the coating solution, thereby drying the semiconductor wafer W. The case 41 may be evacuated while the wafer support table is being rotated. At this time, the wafer support table is rotated at a speed lower than the speed at which the inner cup of the rotary-cup coating device 30 is rotated.

The edge cleaning device 50 has a spinner (not shown) disposed in a case 51 and a nozzle 52 for ejecting a cleaning solution toward the outer circumferential edge of the semiconductor wafer W which is placed on the spinner.

The coating-drying-cleaning station operates as follows:

As shown in FIG. 1, the transfer apparatus 1 is oriented toward the loading/unloading device 20, and the carrier arm 3 is extended into a space below a semiconductor wafer W which is placed on the support table 22 of the loading/unloading device 20. Then, the transfer apparatus 1 is lifted as a whole to receive the semiconductor wafer W from the support table 22 onto the carrier arm 3, which supports a lower surface of the semiconductor wafer W and is thereafter retracted.

Figure 5:
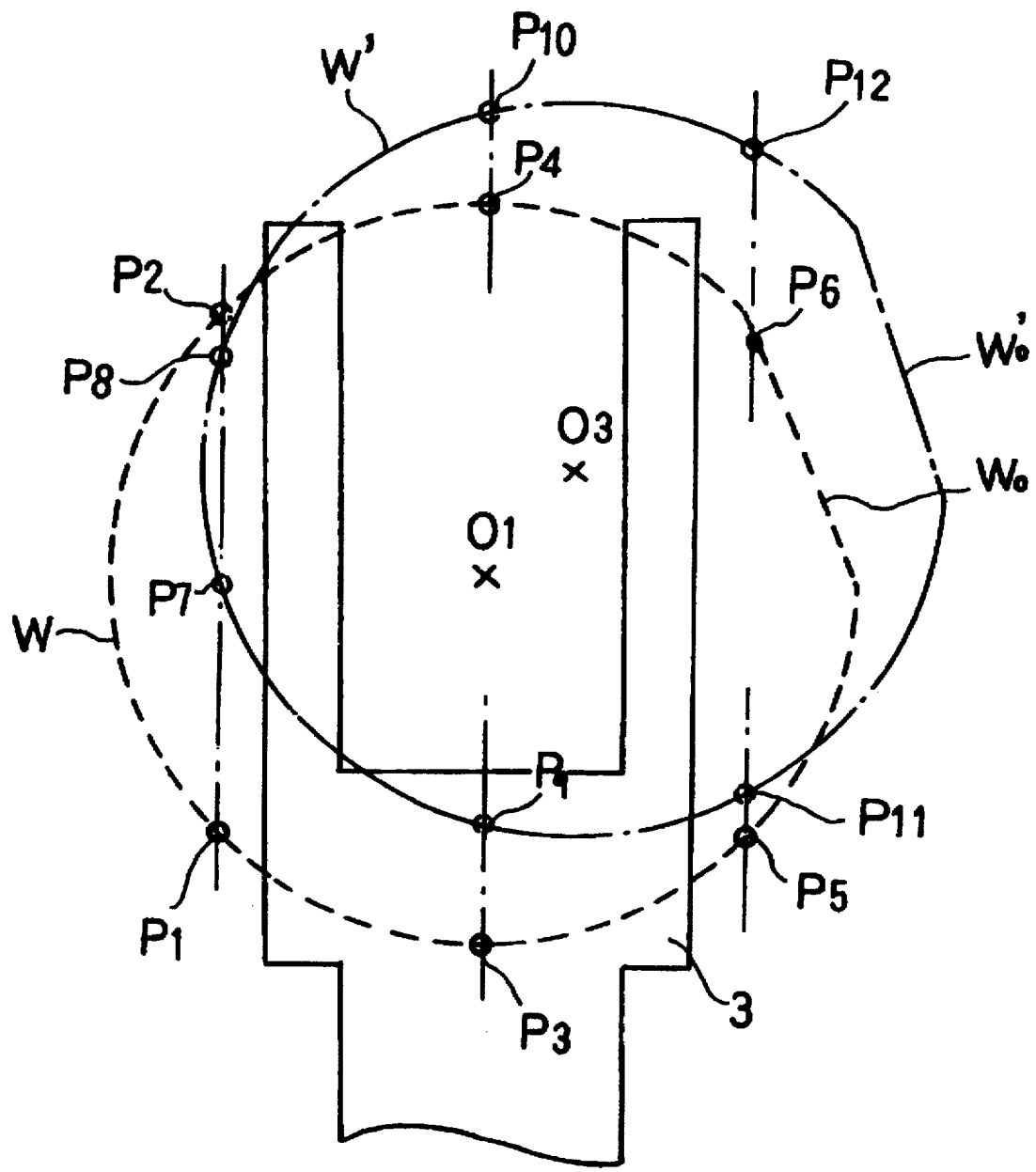
FIG. 5 is an enlarged fragmentary plan view illustrative of principles of a transfer method according to the present invention.

When the carrier arm 3 is retracted, the semiconductor wafer W supported thereon passes or is withdrawn between the light-emitting elements 6a, 7a, 8a and the light-detecting elements 6b, 7b, 8b. The center of the semiconductor wafer W as it passes is detected by the sensors 6, 7, 8 according to the following process:

Upon withdrawal of the semiconductor wafer W as indicated by the dotted line in FIG. 5, the controller 10 detects, at a rate depending on the speed of withdrawal of the semiconductor wafer W, a total of six points, i.e., points P1, P2 of intersection between a line interconnecting the light-emitting element 6a and the light-detecting element 6b and the outer circumferential edge of the semiconductor wafer w, points P3, P4 of intersection between a line interconnecting the light-emitting element 7a and the light-detecting element 7b and the outer circumferential edge of the semiconductor wafer W, and points P5, P6 of intersection between a line interconnecting the light-emitting element 8a and the light-detecting element 8b and the outer circumferential edge of the semiconductor wafer W, based on signals from the sensors 6, 7, 8.

Then, the controller 10 disregards the point P6 at the orientational flat edge Wo, selects three out of the remaining five points, and determines a center O1 of a circumscribed circle that passes through the selected points. The controller 10 regards the determined center O1 as the center of the semiconductor wafer W.

For efficient operation, the transfer apparatus 1 also receives another semiconductor wafer W from the loading/unloading device 20 onto the other carrier arm 4.

Then, as shown in FIG. 2, the transfer apparatus 1 is angularly moved so as to be oriented toward the rotary-cup coating device 30, and then the carrier arm 3 is extended to place the semiconductor wafer W on the inner cup of the rotary-cup coating device 30.

To set the semiconductor wafer W properly on the inner cup of the rotary-cup coating device 30, the controller 10 applies signals to the actuator mechanism to control the angular displacement of the transfer apparatus 1 and the longitudinal movement of the carrier arm 3 for thereby bringing the center O1 of the semiconductor wafer W into alignment with a center O2 of the inner cup of the rotary-cup coating device 30. After the semiconductor wafer W is set on the inner cup, the carrier arm 3 is retracted away from the rotary-cup coating device 30, which then starts coating the semiconductor wafer W.

After the semiconductor wafer W is coated by the rotary-cup coating device 30, the transfer apparatus 1 extends the carrier arm 3, receives the coated semiconductor wafer W on the carrier arm 3, and withdraws the carrier arm 3. While withdrawing the carrier arm 3, the controller 10 detects the center of the coated semiconductor wafer W in the same manner as described above.

Specifically, if the coated semiconductor wafer which is received by the carrier arm 3 is indicated at W' by the imaginary line in FIG. 5, then the controller 10 detects a center O3 of the semiconductor wafer W' based on selected three of points P7, P8, P9, P10, P11, P12 through the sensors 6, 7, 8.

Thereafter, as shown in FIG. 3, the transfer apparatus 1 is angularly moved so as to be oriented toward the evacuating drying device 40, and then the carrier arm 3 is extended to place the semiconductor wafer W on the wafer support table of the evacuating drying device 40. At this time, the controller 10 applies signals to the actuator mechanism to control the angular displacement of the transfer apparatus 1 and the longitudinal movement of the carrier arm 3 for thereby bringing the center O3 of the semiconductor wafer W into alignment with the center O4 of the wafer support table of the evacuating drying device 40.

After the semiconductor wafer W is dried by the evacuating drying device 40, the transfer apparatus 1 receives the semiconductor wafer W from the evacuating drying device 40, and then transfers the semiconductor wafer W into the edge cleaning device 50. At this time, the controller 10 also controls the actuator mechanism to align the center of the semiconductor wafer W with the center of the spinner of the edge cleaning device 50.

In this manner, the transfer apparatus 1 can automatically position the semiconductor wafer W for accurate alignment with the center of each of the rotary-cup coating device 30, the evacuating drying device 40, and the edge cleaning device 50 each time the semiconductor wafer W is transferred to one of the rotary-cup coating device 30, the evacuating drying device 40, and the edge cleaning device 50. Since the transfer apparatus 1 can automatically position the semiconductor wafer W, the coating-drying-cleaning station is not required to have a separate alignment mechanism for aligning the semiconductor wafer W each time it is transferred to one of the rotary-cup coating device 30, the evacuating drying device 40, and the edge cleaning device 50.

The carrier arms 3, 4 of the transfer apparatus 1 may be replaced with belts for carrying the semiconductor wafer W thereon.

The transfer apparatus 1 carries the semiconductor wafer W on the carrier arms 3, 4, rather than gripping the outer circumferential edge of the semiconductor wafer W. Consequently, the transfer apparatus 1 does not damage the outer circumferential edge of the semiconductor wafer W or touches the coating solution on the semiconductor wafer W, so that no deposit of the coating solution is left on the transfer apparatus 1 while the transfer apparatus 1 is handling the semiconductor wafer W.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A method of transferring a circular object, comprising the steps of:
    moving the circular object across at least two sensors while supporting a lower surface of the circular object;
    detecting at least three points on an outer circumferential edge of the circular object with said at least two sensors;
    determining a center of a circumscribed circle passing through the detected three points;
    regarding the determined center as a center of the circular object; and
    transferring the circular object based on said center of the circular object.

2. A method according to claim 1, wherein said circular object comprises a semiconductor wafer having an orientational flat edge in the outer circumferential edge thereof, said moving step comprises moving the semiconductor wafer across three sensors while supporting the lower surface of the semiconductor wafer, and said detecting step comprises detecting said at least three points on the outer circumferential edge of the semiconductor wafer with said three sensors, except on the orientational flat edge thereof.

3. An apparatus for transferring a circular object, comprising:
    carrier means for moving the circular object along a path while supporting a lower surface thereof;
    at least two sensors disposed in said path, for detecting at least three points on an outer circumferential edge of the circular object while being moved by said carrier means; and
    a controller for determining a center of a circumscribed circle passing through the detected three points and regarding the determined center as a center of the circular object, and controlling movement of said carrier means based on the center of the circular object.

4. An apparatus according to claim 3, further comprising a housing, wherein said carrier means comprises a carrier arm movably mounted on said housing for movement along said path.

5. An apparatus according to claim 3, further comprising a housing, wherein said carrier means comprises a pair of carrier arms movably mounted on said housing for movement along said path, said carrier arms being superposed one over the other out of interference with each other.

6. An apparatus according to claim 3, wherein said circular object comprises a semiconductor wafer having an orientational flat edge in the outer circumferential edge thereof, and said apparatus comprises three said sensors disposed in said path, for detecting said at least three points on the outer circumferential edge of the semiconductor wafer except on the orientational flat edge thereof.

7. A method according to claim 1, further including the step of:
    orienting the circular object based on said center of the circular object relative to a predetermined position to which the circular object is transferred in said transferring step.

8. A method according to claim 7, wherein said transferring and orienting steps are also performed while supporting the lower surface of the circular object.

9. An apparatus according to claim 3, wherein said controller controls said movement of said carrier means based on the center of the circular object so that the carrier means transfers the object to a predetermined position and orients the object relative to the predetermined position.

10. An apparatus according to claim 5, wherein said carrier arms each carries one of said circular objects simultaneously.

11. A method of transferring a circular object, comprising the steps of:

providing a carrier means for moving the circular object along a path while supporting a lower surface thereof;

providing at least two sensors in a vicinity of said path and detecting with the sensors at least three points on an outer circumferential edge of the circular object while being moved by said carrier means;

determining a center of a circumscribed circle passing through the detected three points and regarding the detected center as a center of the circular object; and controlling movement of said carrier means based on the regarded center of the circular object.

12. A method of transferring a circular object according to claim 11, wherein the controlling step controls the movement of the carrier means so as to transfer and orient the circular object relative to a predetermined position.

13. A method of transferring a circular object according to claim 11, wherein said circular object comprises a semiconductor wafer having an orientational flat edge, and said sensor providing and detecting step involves providing three said sensors in the vicinity of said path and detecting said at least three points on the outer circumferential edge of said semiconductor wafer, none of said points being on said orientational flat edge.

* * * * *

UNITED STATES PATENT AND TRADEMARK OFFICE
CERTIFICATE OF CORRECTION

PATENT NO. : 5,706,930
DATED : Jan. 13, 1998
INVENTOR(S) : Tsutomu Sahoda, Koji Ueda, Hidenori Miyamoto, Toru Arikawa It is certified that error appears in the above-indentified patent and that said Letters Patent is hereby corrected as shown below:

Item [56]
On the cover page, under "References Cited", for U.S. Patent 5,486,080, change "Siesadzki" to --Sieradzki--.

Column 3, line numbered between 29 & 30, change "the like" to --or the like--.

Column 4, line numbered between 33 & 34, change "wafer w" to --wafer W--.

Column 5, line 56, change "touches" to --touch--.

Signed and Sealed this

Twenty-first Day of April, 1998

Attest:

BRUCE LEHMAN

Attesting Officer

Commissioner of Patents and Trademarks